(12) United States Patent
Liu

(10) Patent No.: US 12,733,090 B2
(45) Date of Patent: Sep. 8, 2026

(54) BRIDGE COUPLING TO SURFACE EMITTERS

(71) Applicant: Credo Technology Group Limited, George Town (KY)

(72) Inventor: Xike Liu, Santa Clara, CA (US)

(73) Assignee: Credo Technology Group Ltd (KY)

( * ) Notice: Subject to any disclaimer, the term of this patent is extended or adjusted under 35 U.S.C. 154(b) by 217 days.

(21) Appl. No.: 18/805,266

(22) Filed: Aug. 14, 2024

(65) Prior Publication Data

US 2026/0052622 A1 Feb. 19, 2026

(51) Int. Cl.
*H05K 1/02* (2006.01)
*G02B 6/42* (2006.01)

(52) U.S. Cl.
CPC ......... *H05K 1/0243* (2013.01); *G02B 6/4228* (2013.01); *G02B 6/4245* (2013.01); *G02B 6/426* (2013.01); *G02B 6/428* (2013.01); *G02B 6/4296* (2013.01); *H05K 1/0242* (2013.01); *H05K 2201/10121* (2013.01); *H05K 2201/10287* (2013.01)

(58) Field of Classification Search
CPC .... H05K 1/0243; H05K 1/117; H05K 1/0242; H05K 2201/10121; H05K 2201/10287; G02B 6/4228; G02B 6/4245; G02B 6/426; G02B 6/428; G02B 6/4296
USPC .......................................................... 361/761
See application file for complete search history.

(56) References Cited

U.S. PATENT DOCUMENTS

| | | | | |
|---|---|---|---|---|
| 7,957,447 B2 | 6/2011 | Matsushita et al. | | |
| 11,495,898 B2 | 11/2022 | Liu et al. | | |
| 11,855,415 B2 | 12/2023 | Liu et al. | | |
| 2006/0223238 A1* | 10/2006 | Koh | .................... | H10W 70/465<br>257/E23.044 |
| 2007/0181908 A1* | 8/2007 | Otremba | ............. | H10W 90/811<br>257/107 |
| 2020/0381897 A1 | 12/2020 | Cestier et al. | | |

* cited by examiner

*Primary Examiner* — Timothy J Thompson
*Assistant Examiner* — Michael F McAllister
(74) *Attorney, Agent, or Firm* — Daniel J. Krueger; Ramey LLP

(57) ABSTRACT

Techniques are provided for reducing crosstalk between bond wires coupling high frequency signals to multiple transducers in an integrated circuit (IC) chip. At least some of the techniques employ a bridge element configured to be bottom mounted to a printed circuit board next to a surface emitter chip. The bridge element may include: device contacts to each be bond wire connected to a respective anode contact of the surface emitter chip; board contacts to each be bond wire connected to a respective signal trace of the printed circuit board; and a signal path for each of the device contacts, the signal path connecting that device contact to a respective one of the board contacts without active amplification.

20 Claims, 3 Drawing Sheets

116
114
102
112
110
108
106
104

108
214
212
RX1
RX2
RX3
RX4
TX1
TX2
TX3
TX4
OPTICAL
DSP
4x200Gbd
(PAM4)
TIA
P.DIODE
OPTIC COUPLER
BRIDGE
VCSEL
114
OPTIC CABLE
206
208
210
I2C
MCU
204
202

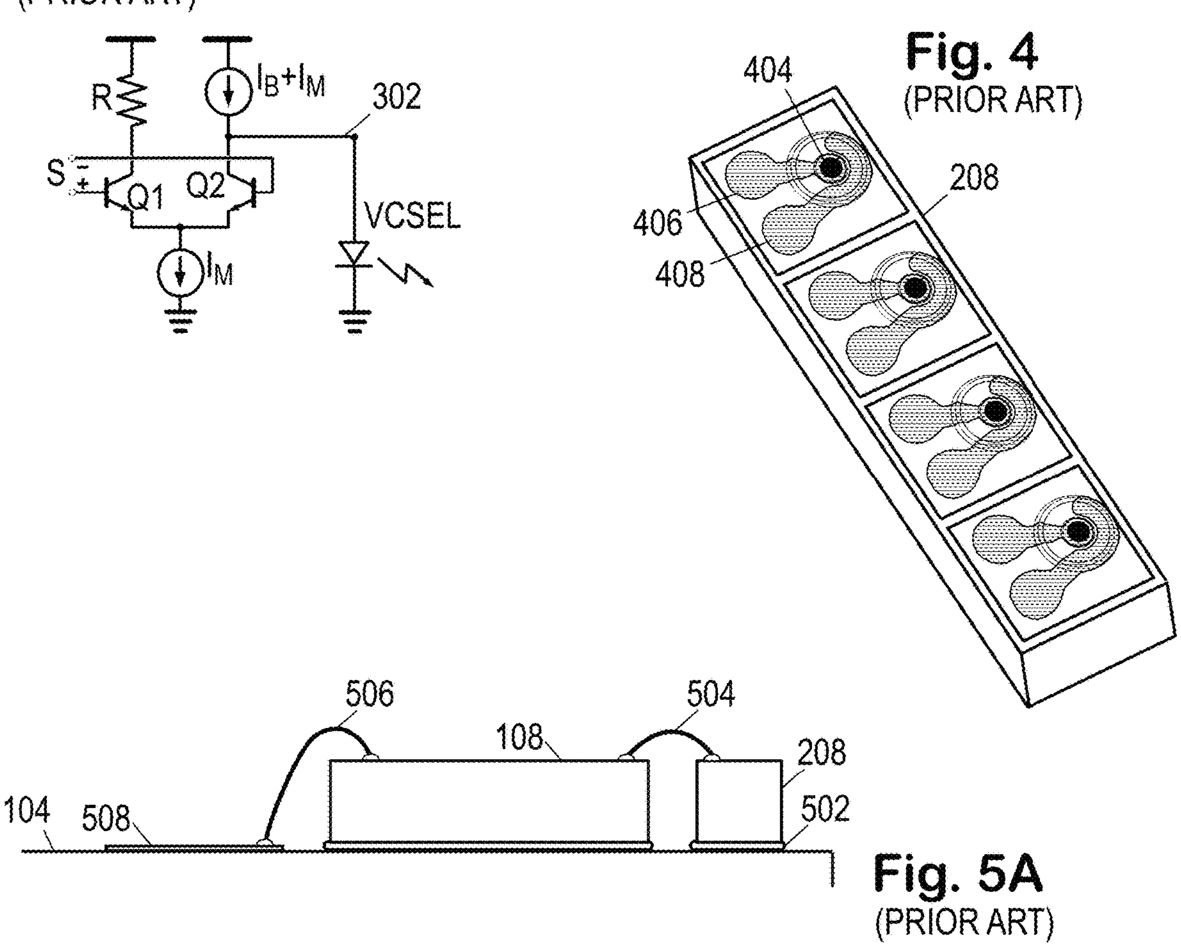
Fig. 3
(PRIOR ART)
R
$I_B+I_M$
302
S
Q1
Q2
VCSEL
$I_M$
Fig. 4
(PRIOR ART)
404
208
406
408
506
504
108
208
104
508
502
Fig. 5A
(PRIOR ART)
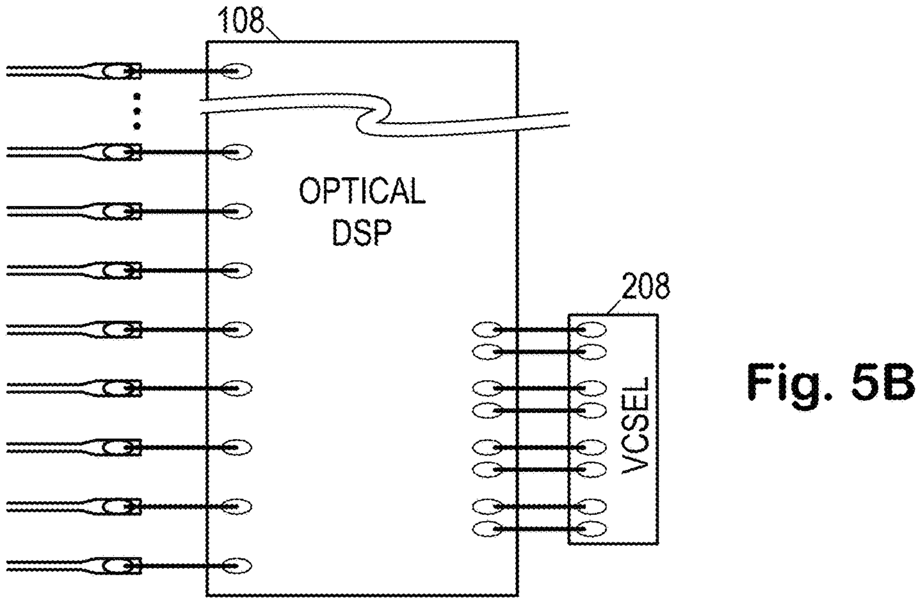
108
OPTICAL
DSP
208
VCSEL
Fig. 5B

BRIDGE COUPLING TO SURFACE EMITTERS

BACKGROUND

Demand continues for ever-increasing volumes and rates of data communication, demand that is gradually being addressed by sophisticated techniques for transmitting and receiving ever-higher frequency and higher-bandwidth signals via various forms of wireless and physical media. The signals are generated by transducers, which in many cases take the form of integrated circuit (IC) chips driven by electrical signals. In at least some instances, the transducers are surface emitters, meaning that the generated signals are emitted from the top surface of the IC chip. The top surface is usually also where the layers are patterned to provide the desired functionality including contact pads for receiving the electrical drive signals. Bond wires are the traditional (and thus the most reliable and usually least expensive) technique for connecting top surface contact pads to a substrate, such as a package substrate, interposer, or printed circuit board (PCB). However, bond wires are unshielded and thus subject to crosstalk at high signal frequencies, particularly where an IC chip contains multiple closely spaced contact pads.

SUMMARY

Accordingly, there are disclosed herein techniques for reducing crosstalk between bond wires coupling high frequency signals to multiple transducers in an integrated circuit (IC) chip. At least some of the techniques employ a bridge element configured to be bottom mounted to a printed circuit board next to a surface emitter chip. The bridge element may include: device contacts to each be bond wire connected to a respective anode contact of the surface emitter chip; board contacts to each be bond wire connected to a respective signal trace of the printed circuit board; and a signal path for each of the device contacts, the signal path connecting that device contact to a respective one of the board contacts without active amplification.

An illustrative printed circuit board assembly includes: a printed circuit board having signal traces; a surface emitter chip bottom-mounted to the printed circuit board; and a passive bridge element bottom-mounted to the printed circuit board next to the surface emitter chip. The surface emitter chip has an array of photoemitter devices with associated anode contacts. The passive bridge element may include: device contacts each bond wire connected to a respective one of the anode contacts; board contacts each bond wire connected to a respective one of the printed circuit board signal traces; and, for each device contact, a signal path connecting that device contact to a respective one of the board contacts without active amplification.

An illustrative cable connector includes: an optical coupling module that optically couples optical fibers to an array of photoemitters on a surface emitter chip bottom-mounted to a printed circuit board, the surface emitter chip having anode contacts for the photoemitters in the array; and a passive bridge element bottom-mounted to the printed circuit board next to the surface emitter chip. The passive bridge element may include: device contacts each bond wire connected to a respective one of the anode contacts; board contacts each bond wire connected to a respective signal trace on the printed circuit board; and for each device contact, a signal path connecting that device contact to a respective one of the board contacts without active amplification.

Each of the foregoing may be implemented individually or in combination, and may be implemented with any one or more of the following features in any suitable combination: 1. each of the device contacts is aligned with the respective one of the anode contacts to minimize a length of the bond wire connection to the respective one of the anode contacts. 2. each of the board contacts is aligned with the respective one of the signal traces to minimize a length of the bond wire connection to the respective one of the signal traces. 3. the board contacts have a pitch at least twice a pitch of the device contacts. 4. at least one of the signal paths couples to at least one passive component from a set consisting of: a shunt resistor, a shunt capacitor, and a shunt inductor. 5. at least one of the signal paths includes at least one passive component from a set consisting of: a series resistor, a series capacitor, and a series inductor. 6. the bridge element includes additional device contacts each bond wire connected to a respective cathode contact for the array of photoemitter devices, each additional device contact connected to a respective board contact by a signal path without active amplification. 7. a data recovery and remodulation device mounted to the printed circuit board in a flip-chip configuration, the data recovery and remodulation device having integrated drivers coupled to the signal traces to drive the array of photoemitter devices. 8. the bridge element includes a semiconductor substrate having a same thickness as the surface emitter chip.

BRIEF DESCRIPTION OF THE DRAWINGS

FIG. 3 is a schematic of an illustrative driver for a surface emitter.

FIG. 4 is an isometric view of an illustrative vertical cavity surface-emitting laser (VCSEL) chip.

FIG. 5A is a side view of a first prior art VCSEL coupling arrangement.

FIG. 5B is a plan view that may correspond to the side view of FIG. 5A.

DETAILED DESCRIPTION

Figure 1:
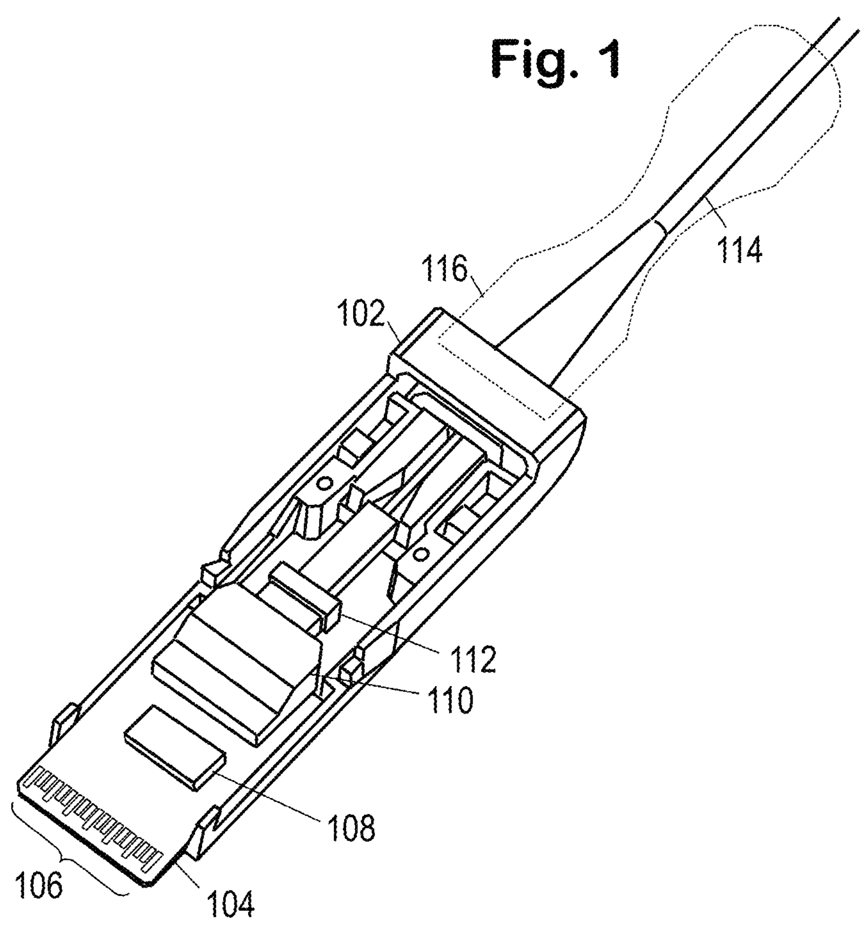
FIG. 1 is a perspective view of an illustrative fiberoptic cable connector.

While specific embodiments are given in the drawings and the following description, keep in mind that they do not limit the disclosure. On the contrary, they provide the foundation for one of ordinary skill to discern the alternative forms, equivalents, and modifications that are encompassed in the scope of the appended claims.

For context, FIG. 1 shows an illustrative connector of a fiberoptic cable such as might be used to connect network devices in a data processing center. A connector frame 102 houses a printed circuit board (PCB) assembly 104 configured with edge connector contacts 106 that mate with contacts in a socket of a host device's network interface port to send and receive electrical signals. The PCB assembly 104 includes one or more packaged integrated circuit (IC)

chips or discrete electrical components mounted to contact pads on the PCB. For example, the PCB assembly 104 may include an optical digital signal processor (DSP) 108 to equalize received signals, recover the data, and retransmit the recovered data, optionally providing error correction, signal format conversion, and lane deskew.

The PCB assembly 104 includes an optical coupling module 110 that couples integrated photodetectors and photoemitters to one or more optical paths. When mated with the optical coupling module 110, a ferrule 112 aligns one or more optical fibers of the fiberoptic cable 114 with the one or more optical paths. The optical coupling module 110 may typically use lenses and prisms to define the optical paths that couple light signals between the optical fibers and the photodetectors and photoemitters, though other optical elements (e.g., mirrors, gratings) would also be suitable. The fiberoptic cable connector may further include a cover and a finger grip 116 to protect the other components from damage during normal use.

Figure 2:
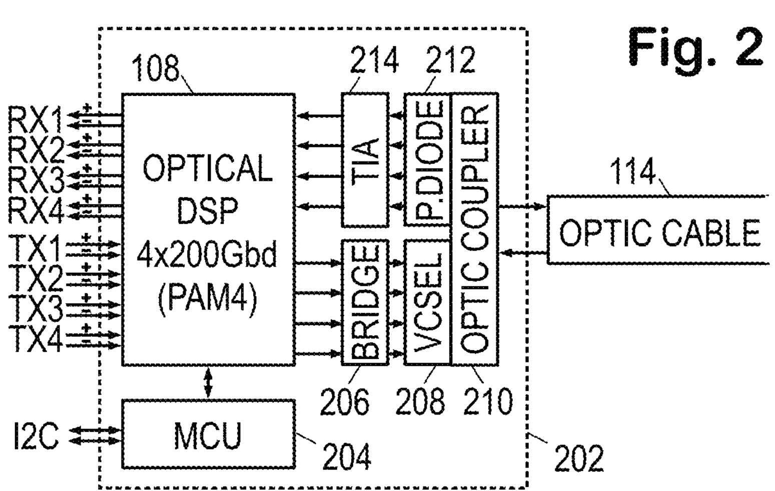
FIG. 2 is a block diagram of an illustrative fiberoptic cable connector.

FIG. 2 is a block diagram to illustrate the signal flows of an illustrative fiberoptic cable connector more clearly 202. An optical DSP 108 couples to the network interface port to accept, e.g., 56 gigabaud (GBd) electrical transmit signals on each of four lanes and to provide 56 GBd electrical receive signals on each of four lanes. The electrical transmit and receive signals are differential signals that may employ non-return to zero (NRZ) signaling or 4-level pulse amplitude modulation (PAM4) signaling. After accounting for overhead, the four signal lanes may use PAM4 signaling to collectively transport data at a nominal 400 gigabits per second (Gbps) (100 Gbps per lane) or 800 Gbps (200 Gbps per lane).

The connector 202 may further include a microcontroller unit (MCU) 204 that couples to the network interface port via a management data bus such as the inter-integrated circuit (I2C) bus or the management data input/output (MDIO) bus. The host may use the management data bus to identify the cable's capabilities, determine connection status, diagnose faults, and/or configure operation of the cable connector. The MCU 204 processes commands received via the management data bus to appropriately read or set the control registers of the optical DSP 108. In at least some cases, the MCU 204 is integrated into the Optical DSP 108.

Optical coupling module 110 (FIG. 1) includes a passive bridge element 206, photoemitter array 208, optical path coupler 210, photodetector array 212, and transimpedance amplification (TIA) device 214. Optical DSP 108 converts the electrical transmit signals into remodulated electrical transmit signals that drive an array of photoemitters 208. As one example discussed further below, the photoemitters in the array are vertical cavity surface-emitting lasers (VCSEL). VCSEL array implementation details are available in the literature including, for example, U.S. Pat. No. 7,957,447 ("VCSEL Array Device and Method for Manufacturing the VCSEL Array Device") and US Pat. App. Pub. 2020/0381897 ("Vertical-cavity Surface-emitting Laser with Characteristic Wavelength of 910 nm"). The electrical drive signals cause current flow in the photoemitters, which in turn emit light signals having an intensity corresponding to the amplitude of the current flow.

The optical DSP 108 preferably includes integrated drivers to power the array of photoemitters without further amplification. Passive bridge element 206 may be a passive device serving to connect surface contacts of the photoemitter array 208 to printed circuit board traces with a geometry that may advantageously reduce signal crosstalk as described further below. Passive bridge element 206 may include circuitry to provide impedance matching without active signal amplification.

An optical path coupler 210 optically couples the light signals from the photoemitters to optical fibers in cable 114 and couples light signals from optical fibers cable 114 to an array of photodetectors 212. Various suitable photodetector implementations are available in the literature. As one example, the photodetectors in the array are photodiodes having an impedance that corresponds to the intensity of a received light signal. The photodiodes can be voltage-biased to convert the impedance into a corresponding current flow. TIA device 214 includes an array of transimpedance amplifiers to amplify the photocurrent flows while transforming them into receive signal voltages.

FIG. 3 is a schematic of an illustrative driver for a photoemitter in array 208. A transmit signal S is supplied as a differential signal to the bases of a differential transistor pair Q1, Q2. When the signal S is at its maximum positive amplitude, current sink $I_M$ draws current through transistor Q1 rather than Q2, such that all of the current from current source $I_B+I_M$ flows through photoemitter VCSEL via node 302. When signal S is at its most negative, current sink $I_M$ draws current through transistor Q2 rather than Q1, such that only the bias current $I_B$ from current source $I_B+I_M$ flows through photoemitter VCSEL.

Although some configurations implement the drivers for the photoemitter array and amplifiers for the photodetector array as support components separate from the optical DSP 108, it may be preferred to include the drivers and amplifiers as integrated elements of the optical DSP chip to reduce cost and power consumption. In any event, it is expected that the gain and output offset of the drivers and amplifiers can be varied adaptively and/or controlled by the MCU 204.

FIG. 4 is an isometric view of a first illustrative integrated circuit chip 208 having an array of VCSEL photoemitters. Each photoemitter in the array has an emitter surface or "window" 404 to the active region, a contact pad 406 for the anode, and a contact pad 408 for the cathode. Current passing through the active region from the anode to the cathode produces coherent light emission from the emitter surface 404. The optical coupling module 110 (FIG. 1) defines optical paths from the emitter surfaces 404 to associated fibers of the fiberoptic cable.

FIG. 5A is a side view of a portion of the PCB assembly 104 to illustrate a first prior art coupling arrangement that may be employed when the optical DSP 108 has integrated driver circuitry. The photoemitter array chip 208 is bottom mounted to the PCB with adhesive 502. The optical DSP chip 108 is bottom-mounted like the photoemitter array chip 208, with surface-to-surface bond wires 504 supplying current from the integrated drivers to the photoemitters. The optical DSP chip 108 may be configured with a thickness that matches that of the photoemitter array chip 208 (e.g., 150 to 200 micrometers), enabling the bond wire lengths to be minimized. The optical DSP chip 108 may have surface contacts connected to printed circuit board signal traces 508 via bond wires 506. The surface-to-board bond wires 506 may have a larger spacing to avoid crosstalk penalties, and the crosstalk between surface-to-surface bond wires 504 may be minimized due to the reduced length of these bond wires. FIG. 5B shows a potential plan view that could correspond to the side view of FIG. 5A.

Though signal crosstalk may be manageable in the coupling arrangement of FIGS. 5A-5B, this arrangement suffers from a notable drawback. In the bottom-mounted configuration, the optical DSP circuitry and transmit drivers are dissipating power at the top surface of the chip. Heat dissipation typically occurs through the mounted surface to the printed circuit board and from the printed circuit board to the outer shell of the connector 102. (Though hidden in FIG. 1, the connector shell may have fins for dissipating heat to the environment). However, the bottom-mounted configuration increases the length and impedance of the heat dissipation path and undesirably elevates the operating temperature of the optical DSP chip 108 and, through proximity, heats the VCSEL array chip 208. The VCSEL array chip is temperature sensitive, and its operation is impaired at higher temperatures.

Figures 6A, 6B, 7A, 7B:
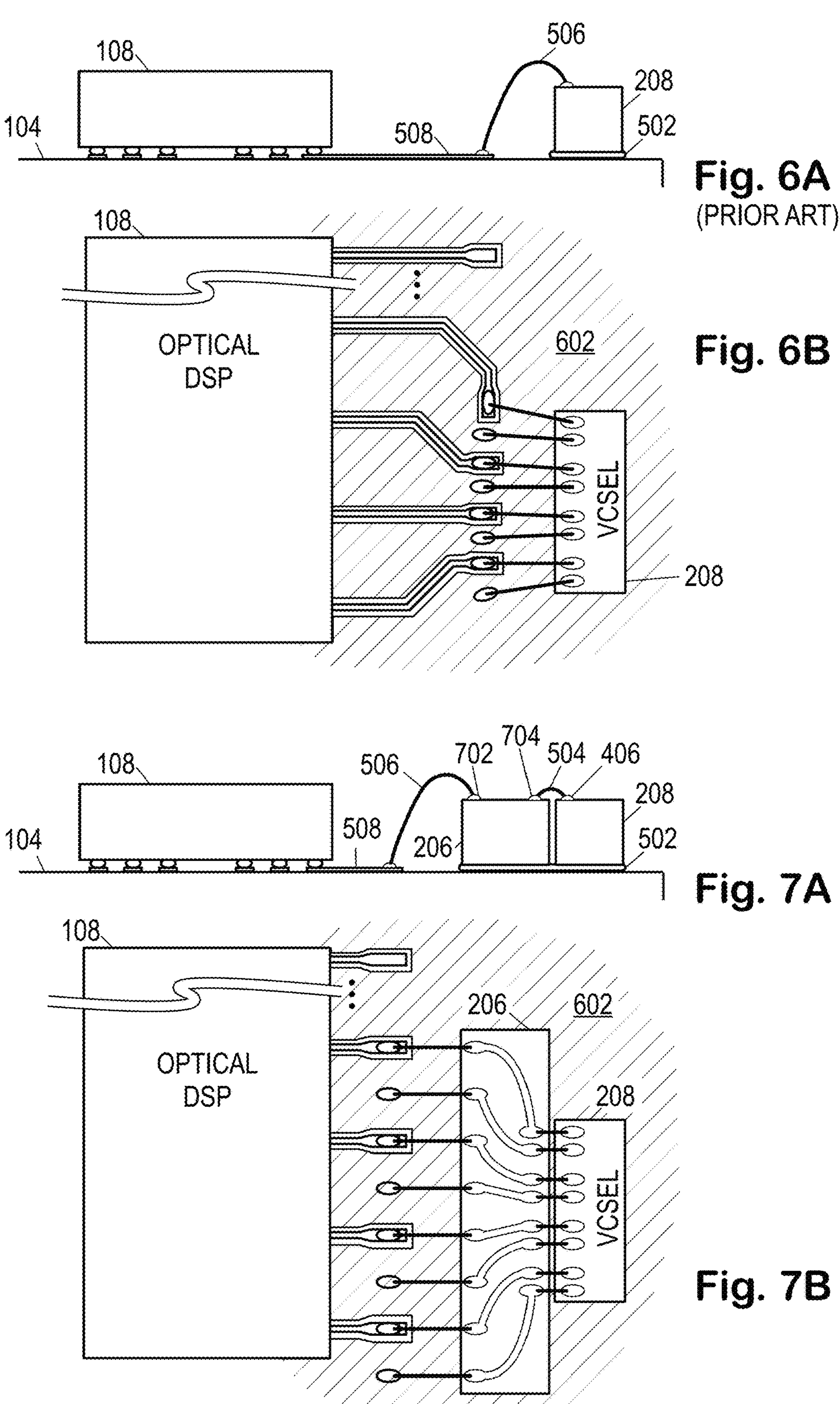
FIG. 6A is a side view of a second prior art VCSEL coupling arrangement.
FIG. 6B is a plan view that may correspond to the side view of FIG. 6A.
FIG. 7A is a side view of an improved VCSEL coupling arrangement.
FIG. 7B is a plan view of the improved VCSEL coupling arrangement.

In contrast, FIGS. 6A-6B show a second prior art coupling arrangement having the optical DSP chip 108 mounted in a flip-chip configuration (i.e., top-mounted) with a ball-grid array providing electrical connection between printed circuit board traces 508 and the surface contacts for the driver chip 504. Printed circuit board traces 508 convey the drive signals to the photoemitter array chip 208 via bond wires 506 connecting the signal traces and the ground plane 602 (or signal traces coupled to ground) to surface contacts of the photoemitter array chip 208. However, we note that the surface contacts of the photoemitter array chip 208 may be spaced at a pitch distance of about 250 microns, necessitating close spacing of the bond wires 506. These closely spaced board-to-surface bond wires 506 may have lengths of around 500 microns. The relatively long bond wires and small pitch distance are expected to incur a substantial crosstalk penalty for this coupling arrangement.

The improved coupling arrangement of FIGS. 7A-7B is accordingly proposed to minimize signal crosstalk. This coupling arrangement employs a passive bridge element 206 having bridge contacts 702 aligned with widely spaced signal traces 508 and device contacts 704 aligned with the anode contacts 406 of the photoemitter array chip 208. Additional device contacts 704 are aligned with the cathode contacts 408 of the photoemitter array chip 208. The bridge element 206 is bottom mounted to the printed circuit board 104 with adhesive 502 and preferably has a thickness that matches that of the photoemitter array chip 208. The passive bridge element 206 may be an integrated circuit chip with a semiconductor substrate, or in an alternative embodiment, a segment of a printed circuit board or another substrate patterned to provide the contacts and interconnecting traces.

The bridge element 206 is a passive device that may provide impedance matching and a geometry that limits crosstalk and electromagnetic interference while excluding active signal amplification and buffering. The bridge element 206 includes traces that may electrically connect each of the device contacts 704 to a corresponding bridge contact 702. The traces may be routed to minimize capacitive coupling between the traces. In some cases, the traces may include or couple to series capacitance, shunt capacitance, series inductance, shunt inductance, series resistance, and/or shunt resistance, to provide impedance matching and thereby minimize reflections from impedance mismatches in the signal paths from the drivers to the photoemitters. The capacitance, inductance, and resistance may be distributed or provided with localized capacitors, inductors, and resistors, respectively. The traces may optionally be given a transmission line type configuration to provide the traces themselves with a desired characteristic impedance.

Though the bridge contacts 702 connect with board-to-surface bond wires 506 similar to previously described arrangements, the pitch of the bridge contacts 702 is at least twice that of the device contacts 704 and preferably three or more times the device contact pitch. In one contemplated embodiment, the pitch of the bridge contacts is between about 0.5 mm and 1.0 mm. The greater spacing between bridge contacts 702 enables the board-to-surface bond wires 506 to have a significantly greater separation, substantially reducing crosstalk therebetween.

The surface-to-surface bond wires 504 have the same spacing as in previously described arrangements, but their length is reduced by about half relative to the board-to-surface bond wires 506. Contemplated surface-to-surface bond wire lengths may be in the range from 100 to 250 microns. The shorter bond wire length significantly reduces the crosstalk therebetween, and even when combined with the crosstalk from the widely spaced board-to-surface bond wires 506, is expected to be significantly less than the crosstalk found in the previously described arrangements. This reduced crosstalk is achieved in combination with the integrated drivers and flip-chip mounting configuration of the optical DSP chip 108, enabling reduced cost and reduced power consumption of the integrated drivers to be combined with more efficient heat dissipation offered by the flip-chip configuration.

The bridge element 206 is passive and consequently has essentially no power consumption and heat-dissipation burden. Bridge element 206 has no minimum distance limitations and may be mounted as close to the photoemitter array chip 208 as desired. An abutting or thermally coupled arrangement between element 206 and chip 208 could be employed with the potential for aiding in heat dissipation from chip 208.

Numerous alternative forms, equivalents, and modifications will become apparent to those skilled in the art once the above disclosure is fully appreciated. It is intended that the claims be interpreted to embrace all such alternative forms, equivalents, and modifications that are encompassed in the scope of the appended claims.

What is claimed is:

1. A printed circuit board assembly that comprises:
a printed circuit board having signal traces;
a surface emitter chip bottom-mounted to the printed circuit board and having an array of photoemitter devices with associated anode contacts; and
a passive bridge element bottom-mounted to the printed circuit board next to the surface emitter chip, the passive bridge element having:
device contacts each bond wire connected to a respective one of the anode contacts;
board contacts each bond wire connected to a respective one of the printed circuit board signal traces; and
for each device contact, a signal path connecting that device contact to a respective one of the board contacts without active amplification.

2. The printed circuit board assembly of claim 1, wherein each of the device contacts is aligned with the respective one of the anode contacts to minimize a length of the bond wire connection to the respective one of the anode contacts.

3. The printed circuit board assembly of claim 2, wherein each of the board contacts is aligned with the respective one of the signal traces to minimize a length of the bond wire connection to the respective one of the signal traces.

4. The printed circuit board assembly of claim 2, wherein the board contacts have a pitch at least twice a pitch of the device contacts.

5. The printed circuit board assembly of claim 1, wherein at least one of the signal paths couples to at least one passive component from a set consisting of: a shunt resistor, a shunt capacitor, and a shunt inductor.

6. The printed circuit board assembly of claim 1, wherein at least one of the signal paths includes at least one passive component from a set consisting of: a series resistor, a series capacitor, and a series inductor.

7. The printed circuit board assembly of claim 1, wherein the passive bridge element further includes additional device contacts each bond wire connected to a respective cathode contact for the array of photoemitter devices, each additional device contact connected to a respective board contact by a signal path without active amplification.

8. The printed circuit board assembly of claim 1 further comprising a data recovery and remodulation device mounted to the printed circuit board in a flip-chip configuration, the data recovery and remodulation device having integrated drivers coupled to the signal traces to drive the array of photoemitter devices.

9. A bridge element configured to be bottom mounted to a printed circuit board next to a surface emitter chip, the bridge element comprising:

device contacts to each be bond wire connected to a respective anode contact of the surface emitter chip;

board contacts to each be bond wire connected to a respective signal trace of the printed circuit board; and a signal path for each of the device contacts, the signal path connecting that device contact to a respective one of the board contacts without active amplification.

10. The bridge element of claim 9, wherein each of the device contacts is positioned to align with the respective anode contact to minimize a length of the bond wire connected to the device contact.

11. The bridge element of claim 10, wherein each of the board contacts is positioned to align with the respective signal trace to minimize a length of the bond wire connected to the board contact.

12. The bridge element of claim 10, wherein the board contacts have a pitch at least twice a pitch of the device contacts.

13. The bridge element of claim 9, wherein at least one of the signal paths couples to at least one passive component from a set consisting of: a shunt resistor, a shunt capacitor, and a shunt inductor.

14. The bridge element of claim 9, wherein at least one of the signal paths includes at least one passive component from a set consisting of: a series resistor, a series capacitor, and a series inductor.

15. The bridge element of claim 9, further comprising additional device contacts each positioned to align a respective cathode contact of the surface emitter chip, each additional device contact connected to a respective board contact by a signal path without active amplification.

16. A cable connector that comprises:

an optical coupling module that optically couples optical fibers to an array of photoemitters on a surface emitter chip bottom-mounted to a printed circuit board, the surface emitter chip having anode contacts for the photoemitters in the array; and a passive bridge element bottom-mounted to the printed circuit board next to the surface emitter chip, the passive bridge element having:

device contacts each bond wire connected to a respective one of the anode contacts;

board contacts each bond wire connected to a respective signal trace on the printed circuit board; and for each device contact, a signal path connecting that device contact to a respective one of the board contacts without active amplification.

17. The cable connector of claim 16, wherein the bridge element includes a semiconductor substrate having a same thickness as the surface emitter chip, and wherein each of the device contacts is aligned with the respective one of the anode contacts to minimize a length of the bond wire connection to the respective one of the anode contacts.

18. The cable connector of claim 17, wherein each of the board contacts is aligned with the respective one of the signal traces to minimize a length of the bond wire connection to the respective one of the signal traces.

19. The cable connector of claim 17, wherein the board contacts have a pitch at least twice a pitch of the device contacts.

20. The cable connector of claim 19, further comprising a data recovery and remodulation device mounted to the printed circuit board in a flip-chip configuration, the data recovery and remodulation device having integrated drivers coupled to the signal traces to drive the array of photoemitter devices.

* * * * *